United States Patent
Kuraguchi et al.

(10) Patent No.: US 9,337,300 B2
(45) Date of Patent: May 10, 2016

(54) NITRIDE-BASED SEMICONDUCTOR DEVICE

(71) Applicant: Kabushiki Kaisha Toshiba, Minato-ku, Tokyo (JP)

(72) Inventors: Masahiko Kuraguchi, Kanagawa (JP); Akira Yoshioka, Ishikawa (JP); Miki Yumoto, Kanagawa (JP); Hisashi Saito, Kanagawa (JP); Kohei Oasa, Ishikawa (JP); Toru Sugiyama, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/215,203

(22) Filed: Mar. 17, 2014

(65) Prior Publication Data

US 2014/0284613 A1  Sep. 25, 2014

(30) Foreign Application Priority Data

Mar. 22, 2013  (JP) .................................. 2013-059322

(51) Int. Cl.
| | |
|---|---|
| *H01L 29/739* | (2006.01) |
| *H01L 29/66* | (2006.01) |
| *H01L 29/78* | (2006.01) |
| *H01L 29/778* | (2006.01) |
| *H01L 29/20* | (2006.01) |

(52) U.S. Cl.
CPC ...... *H01L 29/66462* (2013.01); *H01L 29/7787* (2013.01); *H01L 29/78* (2013.01); *H01L 29/2003* (2013.01); *H01L 29/66431* (2013.01)

(58) Field of Classification Search
CPC ..................... H01L 29/2003; H01L 29/66431; H01L 29/66462; H01L 29/78; H01L 29/7787
USPC ......................................... 257/183, 192, 194
See application file for complete search history.

(56) References Cited

U.S. PATENT DOCUMENTS 8,035,128 B2   10/2011  Ikeda et al.
2008/0121895 A1*  5/2008  Sheppard et al. ............... 257/76
(Continued)

FOREIGN PATENT DOCUMENTS

JP   H10-270664 A   10/1998
JP   2008-130672 A   6/2008
(Continued)

OTHER PUBLICATIONS

Korean Office Action issued on Feb. 9, 2015 in corresponding Korean patent application No. 10-2013-162123, along with English translation.

(Continued)

*Primary Examiner* — Matthew E Warren
(74) *Attorney, Agent, or Firm* — White & Case LLP

(57) ABSTRACT

A semiconductor device according to an embodiment includes a nitride semiconductor layer, a gate electrode provided above the nitride semiconductor layer, a source electrode provided above the nitride semiconductor layer, a drain electrode provided above the nitride semiconductor layer at a side opposite to the source electrode with respect to the gate electrode, a first silicon nitride film provided above the nitride semiconductor layer between the drain electrode and the gate electrode, and a second silicon nitride film provided between the nitride semiconductor layer and the gate electrode, an atomic ratio of silicon to nitrogen in the second silicon nitride film being lower than an atomic ratio of silicon to nitrogen in the first silicon nitride film.

9 Claims, 8 Drawing Sheets

(56) References Cited

U.S. PATENT DOCUMENTS

| | | |
|---|---|---|
| 2008/0135880 A1 | 6/2008 | Yoshida et al. |
| 2010/0025730 A1 | 2/2010 | Heikman et al. |
| 2010/0244104 A1 | 9/2010 | Makiyama et al. |
| 2012/0043591 A1 | 2/2012 | Takada |
| 2013/0083568 A1* | 4/2013 | Makiyama et al. ............. 363/37 |

FOREIGN PATENT DOCUMENTS

| | | |
|---|---|---|
| JP | 2009-267155 A | 11/2009 |
| JP | 2010-118556 A | 5/2010 |
| JP | 2010-206110 A | 9/2010 |
| JP | 2010-238982 A | 10/2010 |
| JP | 2011-155116 A | 8/2011 |
| JP | 2011-529639 A | 12/2011 |
| JP | 2012-044003 A | 3/2012 |
| JP | 2012-248632 A | 12/2012 |
| WO | 2012111363 A1 | 8/2012 |

OTHER PUBLICATIONS

Japanese Office Action issued on Jul. 21, 2015 in corresponding Japanese Application No. 2013-059322, along with English translation thereof.

Japanese Office Action issued on Feb. 16, 2016 in corresponding Japanese Application No. 2013-059322, along with English translation thereof.

* cited by examiner

US 9,337,300 B2

NITRIDE-BASED SEMICONDUCTOR DEVICE

CROSS-REFERENCE TO RELATED APPLICATION

This application is based upon and claims the benefit of priority from Japanese Patent Application No. 2013-059322, filed on Mar. 22, 2013, the entire contents of which are incorporated herein by reference.

FIELD

Embodiments described herein relate generally to a semiconductor device and a method of manufacturing the same

BACKGROUND

Nitride semiconductors having high dielectric breakdown strength are expected to be applied to semiconductor devices for power electronics, high-frequency power semiconductor devices, or the like. However, when a high voltage is applied, a phenomenon such as current collapse occurs. When current collapse occurs, on-resistance increases and a drain current significantly decreases. This phenomenon is known to degrade characteristics of semiconductor devices.

In order to implement high-performance nitride-based semiconductor devices, it is desirable to suppress current collapse.

DETAILED DESCRIPTION

A semiconductor device according to an embodiment includes a nitride semiconductor layer, a gate electrode provided above the nitride semiconductor layer, a source electrode provided on the nitride semiconductor layer, a drain electrode provided on the nitride semiconductor layer at a side opposite to the source electrode with respect to the gate electrode, a first silicon nitride film provided on the nitride semiconductor layer between the drain electrode and the gate electrode, and a second silicon nitride film provided between the nitride semiconductor layer and the gate electrode, an atomic ratio of silicon to nitrogen in the second silicon nitride film being lower than an atomic ratio of silicon to nitrogen in the first silicon nitride film.

In this specification, an atomic ratio of silicon to nitrogen represents a ratio (the number of silicon atoms/the number of nitrogen atoms) of the number of silicon atoms to the number of nitrogen atoms in the same volume.

(First embodiment)

A semiconductor device of the present embodiment includes a nitride semiconductor layer, a gate electrode that is formed on or above the nitride semiconductor layer, a source electrode that is formed on or above the nitride semiconductor layer, a drain electrode that is formed on or above the nitride semiconductor layer at a side opposite to the source electrode with respect to the gate electrode, a first silicon nitride film that is formed on or above the nitride semiconductor layer between the drain electrode and the gate electrode, and a second silicon nitride film that is formed between the nitride semiconductor layer and the gate electrode and lower in an atomic ratio of silicon to nitrogen than the first silicon nitride film.

Figure 1:
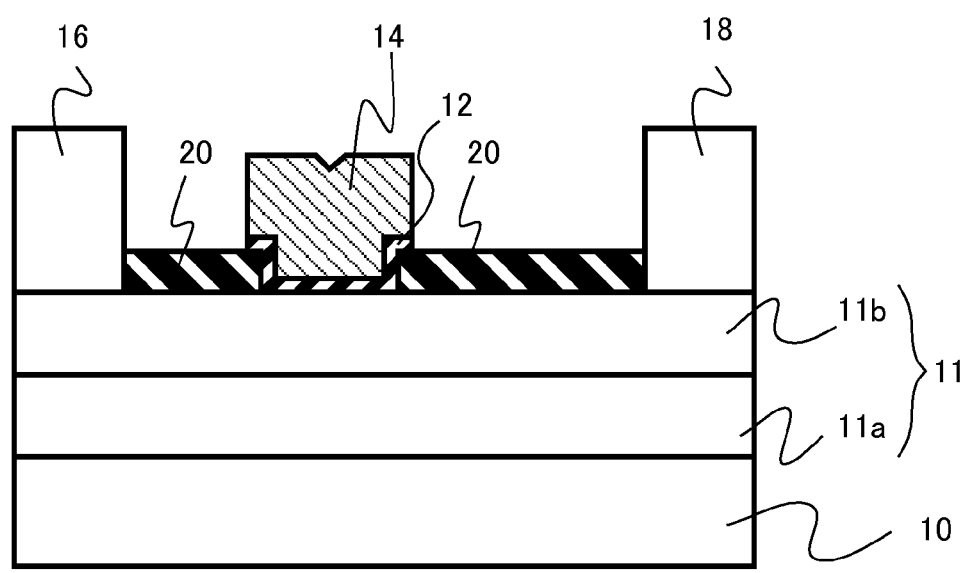
FIG. 1 is a cross-sectional view illustrating a structure of a semiconductor device of a first embodiment.

FIG. 1 is a cross-sectional view illustrating a structure of a semiconductor device of the present embodiment. The semiconductor device is formed on a nitride semiconductor layer 11 above a substrate 10. For example, the substrate 10 is made of silicon (Si).

A buffer layer (not illustrated) is formed between the substrate 10 and the nitride semiconductor layer 11. The buffer layer has a function of mitigating a lattice mismatch between the substrate 10 and the nitride semiconductor layer 11. For example, the buffer layer is formed to have a multi-layer structure of aluminum gallium nitride ($Al_xGa_{1-x}N$ (0<x<1)).

Further, the nitride semiconductor layer 11 has a stacked structure in which an active layer (a channel layer) 11a and a barrier layer (an electron supply layer) 11b are stacked. The active layer 11a is made of, for example, gallium nitride (GaN), and the barrier layer 11b is made of, for example, aluminum gallium nitride (AlGaN). The barrier layer 11b can have a structure made of one of gallium nitride (GaN), aluminum gallium nitride ($Al_xGa_{1-x}N$ (0<x<1)), indium nitride (InN), indium nitride aluminum ($In_yAl_{1-y}N$ (0<y<1)), and indium nitride gallium ($In_zGa_{1-z}N$ (0<z<1)) or a combination thereof.

A hetero junction interface is formed between the active layer 11a and the barrier layer 11b. For example, the active layer 11a has the film thickness of 0.1 to 10 μm, and the barrier layer 11b has the film thickness of 10 to 50 nm.

In the present embodiment, an example of a high-electron-mobility transistor (HEMT) that is a field effect transistor (FET) using a hetero junction of a dual-layer nitride semiconductor layer is illustrated. However, the structure of the nitride semiconductor layer is not limited to the dual-layer structure, and the structure of the present embodiment can be applied to nitride semiconductor layers having various layer structures. As in the present embodiment, an HEMT using a hetero junction is high in channel mobility and can be low in the on-resistance and can be applied to semiconductor devices for power electronics. Further, high channel mobility is suitable even for a high-frequency operation.

A gate electrode 14 is formed above the nitride semiconductor layer 11 with a second silicon nitride film 12 interposed therebetween. The second silicon nitride film 12 functions as a gate insulating film. For example, the gate electrode 14 is a metallic electrode. For example, the metallic electrode is a nickel (Ni) electrode, a titanium (Ti) electrode, an aluminum (Al) electrode, or titanium nitride (TiN).

Further, a source electrode 16 and a drain electrode 18 are formed above the nitride semiconductor layer 11 with the gate electrode 14 interposed therebetween. The source electrode 16 and the drain electrode 18 are apart from the gate electrode 14. For example, the source electrode 16 and the drain electrode 18 are a metallic electrode, and the metallic electrode is an electrode made primarily of, for example, aluminum (Al). Preferably, an ohmic contact is formed between each of the source electrode 16 and the drain electrode 18 and the nitride semiconductor layer 11.

A first silicon nitride film 20 is formed on the nitride semiconductor layer 11 between the source electrode 16 and the gate electrode 14 and between the drain electrode 18 and gate electrode. The first silicon nitride film 20 is formed to come into contact with the surface of the nitride semiconductor layer 11. The first silicon nitride film 20 functions as a passivation film that protects the surface of the nitride semiconductor layer 11 between the gate electrode 14 and the source electrode 16 and between the gate electrode 14 and the drain electrode 18.

The second silicon nitride film 12 is lower in a silicon (Si)/nitrogen (N) ratio, that is, an atomic ratio of silicon atoms to nitrogen atoms than the first silicon nitride film 20. For example, the atomic ratio of silicon to nitrogen in the first silicon nitride film 20 is 0.75 or more and less than 0.9 and the atomic ratio of silicon to nitrogen in the second silicon nitride film 12 is 0.6 or more and less than 0.75. The atomic ratio of silicon to nitrogen in the silicon nitride film can be derived by measurement using a rutherford backscattering spectrometry (RBS) or an X-ray photoelectron spectroscopy (XPS).

In semiconductor devices using a nitride semiconductor, it is known that a phenomenon such as current collapse that a drain current decreases when high voltage stress is applied between the source electrode and the drain electrode occurs. The current collapse is considered to be caused by a charge trapping formed in a current path of a semiconductor device.

Generally, aluminum (Al) is easily combined with oxygen, and oxygen is introduced during crystal growth of an aluminum gallium nitride of the barrier layer 11b. Oxygen combined with aluminum functions as a charge trapping. Further, nitrogen on the outermost surface of the barrier layer 11b is likely to escape during crystal growth or a subsequent manufacturing process, and thus there is deficiency in nitrogen. The deficiency in nitrogen functions as a charge trapping.

When high voltage stress is applied between the source electrode and the drain electrode, charges are trapped in a surface level of oxygen existing in a current path or the deficiency in nitrogen. As a result, a drain current decreases, and current collapse is considered to occur.

The amount of the surface level in which the current collapse is caused is considered to depend on the film properties of a film formed on the surface of a nitride semiconductor such as a silicon nitride film. Meanwhile, in a film formed on the surface of a nitride semiconductor, particularly, in a gate insulating film, it is desirable that a leakage current of a film as well as current collapse decrease. In this regard, the inventors paid attention on a relation among the film properties of a silicon nitride film formed on the surface of the nitride semiconductor, current collapse, and the leakage current.

Figure 2:
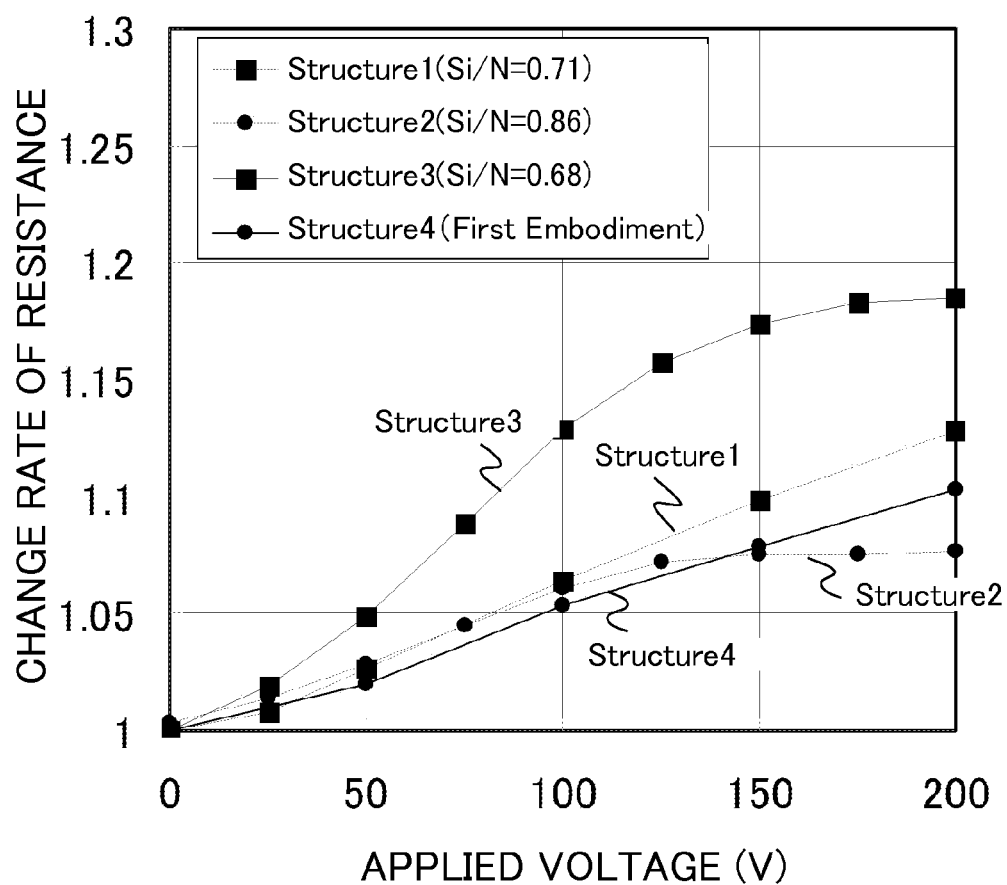
FIG. 2 is a diagram illustrating a relation between a plurality of device structures and current collapse.

FIG. 2 is a diagram illustrating a relation between a plurality of device structures and current collapse. The device structure is an HEMT, similarly to FIG. 1. A horizontal axis represents a voltage applied as stress, and a vertical axis represents a change rate of on-resistance after the stress is applied. In other words, FIG. 2 illustrates a rate at which the drain current decreases, and the on-resistance increases as a result of a current collapse phenomenon. As a number of the change rate of the on-resistance increases, the current collapse increases.

A structure 1 represents an example in which a silicon nitride film in which the atomic ratio (Si/N) of silicon to nitrogen is 0.71 is applied as both the first silicon nitride film (passivation film) 20 and the second silicon nitride film (gate insulating film) 12 illustrated in FIG. 1. A structure 2 represents an example in which a silicon nitride film in which the atomic ratio (Si/N) of silicon to nitrogen is 0.86 is applied as both the first silicon nitride film 20 and the second silicon nitride film 12 illustrated in FIG. 1. A structure 3 represents an example in which a silicon nitride film in which the atomic ratio (Si/N) of silicon to nitrogen is 0.68 is applied as both the first silicon nitride film 20 and the second silicon nitride film 12 illustrated in FIG. 1.

A structure 4 is a device structure corresponding to the present embodiment. In other words, the structure 4 represents an example in which a silicon nitride film in which the atomic ratio (Si/N) of silicon to nitrogen is 0.86 is applied as the first silicon nitride film 20 illustrated in FIG. 1, and a silicon nitride film in which the atomic ratio (Si/N) of silicon to nitrogen is 0.68 is applied as the second silicon nitride film 12.

As can be understood from the results of the structures 1 to 3 of FIG. 2, when a silicon nitride film having a high atomic ratio of silicon to nitrogen is applied, a change rate of resistance is small. In other words, the current collapse is suppressed. In view of suppression of the current collapse, the atomic ratio of silicon to nitrogen is preferably 0.75 or more, and more preferably 0.80 or more.

As described above, one of the reasons why the current collapse is suppressed by applying a silicon nitride film having a high atomic ratio of silicon to nitrogen is also considered to be because there are many bonds (Si—H bonds) of silicon and hydrogen in a film having rich silicon.

In other words, when hydrogen is supplied from the silicon nitride film to the barrier layer 11b, oxygen to be bonded to aluminum in the barrier layer 11b is desorbed by reduction. Further, oxygen functioning as a charge trapping decreases from the barrier layer 11b, and thus the current collapse is suppressed.

Further, as hydrogen is supplied from the silicon nitride film, a dangling bond of silicon (Si) occurring due to deficiency in nitrogen in the barrier layer 11b is considered to be combined with hydrogen and hydrogen-terminated. Further, deficiency in nitrogen functioning as a charge trapping decreases from the barrier layer 11b, and thus the current collapse is suppressed.

In the structure of FIG. 1, the charge trapping causing the current collapse is considered to occur primarily between the gate electrode 14 and the drain electrode 18 between which a high electric field is formed. Thus, it is preferable that the atomic ratio of silicon to nitrogen in the first silicon nitride film 20 formed on the barrier layer 11b, particularly, between the gate electrode 14 and the drain electrode 18 be high. When the atomic ratio of silicon to nitrogen is 0.75, a single crystalline is obtained, but when excess silicon exists, silicon is bonded to hydrogen, and hydrogen is likely to be included. Thus, it is preferable that the atomic ratio of silicon to nitrogen be 0.75 or more. Further, it is preferable that the atomic ratio of silicon to nitrogen be 1.0 or less. It is because it is difficult to contain silicon in a crystal at a ratio higher than 1.0.

In order to increase the amount of hydrogen supplied from the first silicon nitride film 20, it is preferable that the hydrogen content of the first silicon nitride film 20 be 1 at. % (atom percentage) or more and 50 at. % or less. It is because when the hydrogen content is below this range, the current collapse may not be sufficiently suppressed. Further, it is because when the hydrogen content exceeds this range, it is difficult to contain hydrogen. In view of suppression of the current collapse, the hydrogen content is preferably 10 at. % or more, and more preferably 20 at. % or more. In this case, the hydrogen content represents an atom percentage of hydrogen in a silicon nitride film.

For example, the hydrogen content in a film can be measured by a secondary ion-microprobe mass spectrometry (SIMS) technique. In case of the structure 1, the hydrogen content of the silicon nitride film is 0.3 at. %, and in case of the structure 2, the hydrogen content of the silicon nitride film is 23 at. %.

Figure 3:
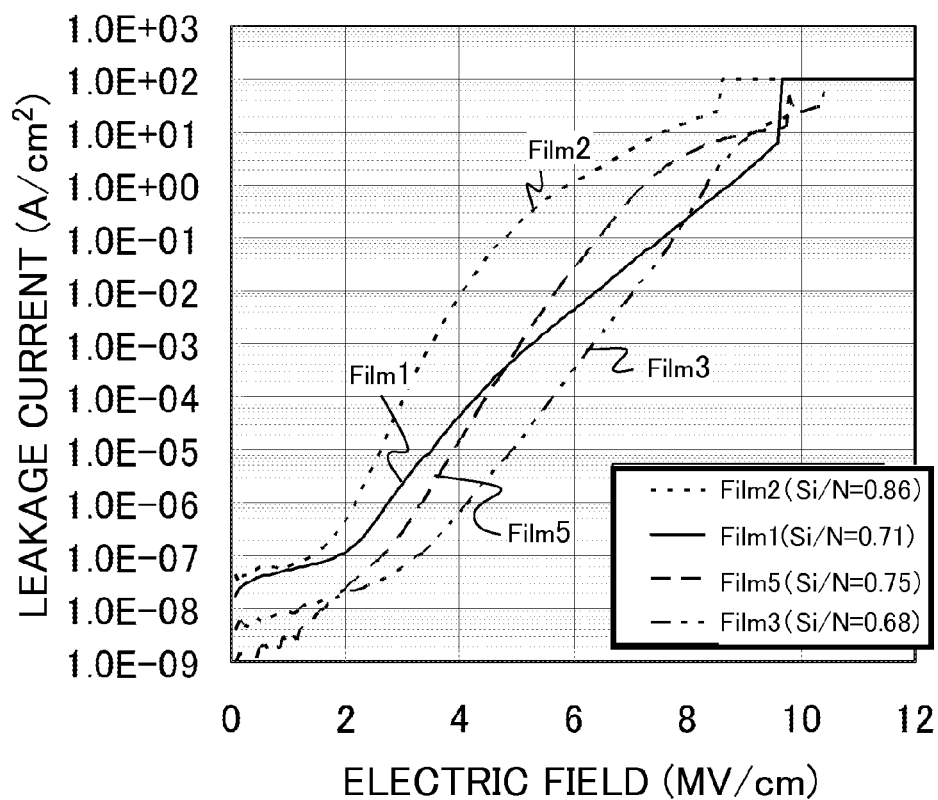
FIG. 3 is a diagram illustrating an evaluation result of a gate leakage current on a plurality of silicon nitride films.

FIG. 3 is a diagram illustrating an evaluation result of a gate leakage current on a plurality of silicon nitride films. In FIG. 3, a film 1 represents a silicon nitride film using the structure 1 of FIG. 2 in which the atomic ratio of silicon to nitrogen is 0.71. A film 2 represents a silicon nitride film using the structure 2 of FIG. 2 in which the atomic ratio of silicon to nitrogen is 0.86. A film 3 represents a silicon nitride film using the structure 3 of FIG. 2 in which the atomic ratio of silicon to nitrogen is 0.68. A film 5 represents a silicon nitride film in which the atomic ratio of silicon to nitrogen is 0.75.

As can be understood from FIG. 3, when the atomic ratio of silicon to nitrogen is low, that is, when a silicon nitride film having a small amount of silicon is applied, agate leakage current is suppressed. It is considered to be because Si—H bonds existing in a silicon nitride film function as a path of a leakage current. In view of suppression of a gate leakage current, the atomic ratio of silicon to nitrogen is preferably less than 0.75 and more preferably 0.71 or less.

As described above, in view of suppression of the current collapse, it is desirable to apply a silicon nitride film having a high atomic ratio of silicon to nitrogen, and in view of suppression of the gate leakage current, it is desirable to apply a silicon nitride film having a low atomic ratio of silicon to nitrogen.

In the semiconductor device of the present embodiment, a silicon nitride film having a relatively high atomic ratio of silicon to nitrogen is applied as the first silicon nitride film 20 functioning as the passivation film between the gate electrode 14 and the drain electrode 18. Further, a silicon nitride film having a relatively low atomic ratio of silicon to nitrogen is applied as the second silicon nitride film 12 functioning as the gate insulating film. Thus, according to the semiconductor device of the present embodiment, it is possible to suppress the current collapse while suppressing the gate leakage current.

As described above, the hydrogen content of the silicon nitride film depends on the atomic ratio of silicon to nitrogen. It is preferable that the atomic ratio of silicon to nitrogen in the second silicon nitride film 12 be lower than that in the first silicon nitride film 20. Thus, it is preferable that the hydrogen content of the second silicon nitride film 12 be lower than the hydrogen content of the first silicon nitride film 20.

The structure 4 in FIG. 2 is a current collapse evaluation result in the device structure of the semiconductor device of the present embodiment. A silicon nitride film having a low atomic ratio of silicon to nitrogen is applied as the second silicon nitride film 12, but a silicon nitride film having a high atomic ratio of silicon to nitrogen is applied as the first silicon nitride film 20, and thus the current collapse is suppressed.

Further, it is preferable that a dielectric constant of the first silicon nitride film 20 be 4 or more and 7 or less. A dielectric constant of a silicon nitride film depends on the hydrogen content, and as the hydrogen content increases, the dielectric constant is lowered. When the dielectric constant is 7 or less, hydrogen enough to reduce a trapping is considered to be contained in a film. There is little silicon nitride film in which a dielectric constant is less than 4.

Further, it is preferable that the first silicon nitride film 20 has tensile stress. Stress of a silicon nitride film depends on the hydrogen content, and a silicon nitride film containing hydrogen enough to reduce a trapping has tensile stress.

Further, it is preferable that a refractive index of the first silicon nitride film 20 be 2 or more and 3.5 or less. A refractive index of a silicon nitride film depends on an atomic ratio of silicon to nitrogen in a film, and as the atomic ratio of silicon to nitrogen increases, the refractive index increases. When a refractive index of a silicon nitride film is 2 or more, the silicon nitride film has an atomic ratio of silicon to nitrogen which is enough to suppress the current collapse. There is little silicon nitride film in which the refractive index is larger than 3.5.

Further, by causing chlorine to be contained in a silicon nitride film, it is possible to suppress a leakage current. It is preferable that the chlorine content of the second silicon nitride film 12 be 0.5 at. % or more and 5 at. %% or less. It is because when the chlorine content is below this range, the leakage current may not be sufficiently suppressed. Further, it is because when the chlorine content exceeds this range, it is difficult to form a film. In view of further suppression of the leakage current, it is preferable that the chlorine content be 1% at. % or more. In this case, the chlorine content represents a chlorine atomic ratio in a silicon nitride film. For example, the chlorine content in a film can be calculated by the SIMS technique.

Further, by causing oxygen to be contained in a silicon nitride film, it is possible to suppress the leakage current. In view of suppression of a gate leakage current, it is preferable that oxygen atoms of $1\times10^{19}$ cm$^{-3}$ or more be contained in the second silicon nitride film 12. However, when oxygen is excessively contained in a passivation film, the barrier layer 11b is oxidized, and the current collapse is likely to increase. Thus, the oxygen content of the first silicon nitride film 20 is preferably smaller than the oxygen content of the second silicon nitride film 12. For example, the oxygen content in a film can be calculated by the SIMS technique. In view of suppression of the current collapse, it is preferable that oxygen atoms of $1\times10^{20}$ cm$^{-3}$ or less be contained in the first silicon nitride film 20.

For the second silicon nitride film 12 functioning as a gate insulating film, in order to reduce a leakage current, a thick film is desirable, but as a film thickness increases, a threshold value negatively increases. Thus, for a switching element for power electronics, it is preferable that a film thickness be 50 nm or less.

Further, when a high electric field is applied to an element as a semiconductor for power electronics, in case of a lateral element, a high electric field is applied even to a passivation film. In this regard, the first silicon nitride film 20 functioning as a passivation film needs a certain thickness, and a film thickness thereof is preferably 20 nm or more.

Next, a method of manufacturing the semiconductor device of this embodiment is described. A method of manufacturing a semiconductor device of the present embodiment includes forming a first silicon nitride film on a nitride semiconductor layer, removing a portion of the first silicon nitride film, exposing the nitride semiconductor layer, and forming a second silicon nitride film that is lower in an atomic ratio of silicon to nitrogen than the first silicon nitride film on the nitride semiconductor layer, forming a gate electrode on the second silicon nitride film, forming a source electrode on the nitride semiconductor layer, and forming a drain electrode on the nitride semiconductor layer at a side opposite to the source electrode with respect to the gate electrode. The first silicon nitride film is formed using a plasma-enhanced chemical vapor deposition (PE-CVD) technique, and the second silicon nitride film is formed using the PE-CVD technique under a condition that an atomic ratio of silicon to nitrogen in source gas is smaller than when the first silicon nitride film is formed.

FIGS. 4 through 8 are schematic cross-sectional views illustrating the method of manufacturing the semiconductor device of this embodiment.

Figure 4:
FIG. 4 is a schematic cross-sectional view illustrating the method of manufacturing the semiconductor device of the first embodiment.

First of all, for example, a substrate 10 made of silicon is prepared. Then, an active layer 11a and a barrier layer 11b with a buffer layer (not illustrated) interposed therebetween is formed on the substrate 10, for example, by a metal-organic CVD (MOCVD) technique (FIG. 4). For example, the buffer layer is formed to have a multi-layer structure of aluminum gallium nitride ($Al_xGa_{1-x}N$ (0<x<1)). The active layer 11a is formed of, for example, gallium nitride (GaN) at the film thickness of 0.1 to 10 μm, and the barrier layer 11b is formed of, for example, aluminum gallium nitride (AlGaN) at the film thickness of 10 to 50 nm.

Then, a first silicon nitride film 20 is formed on the nitride semiconductor layer 11 having the structure in which the active layer 11a and the barrier layer 11b are stacked. The first silicon nitride film 20 is formed using the plasma-enhanced chemical vapor deposition (PECVD) technique. For example, the film thickness of the first silicon nitride film 20 is 20 to 50 nm.

Figure 5:
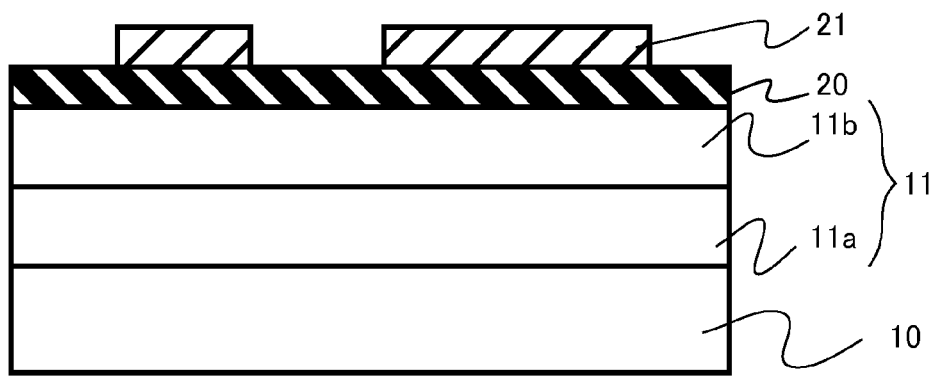
FIG. 5 is a schematic cross-sectional view illustrating the method of manufacturing the semiconductor device of the first embodiment.

Then, a photoresist film 21 is formed on the first silicon nitride film 20 by the photolithography technique (FIG. 5). Then, the first silicon nitride film 20 is patterned by the wet etching technique using the photoresist film 21 as the etching mask. The first silicon nitride film 20 is selectively removed, and thus portions of the barrier layer 11b corresponding to regions on which a gate electrode, a source electrode, and a drain electrode are to be formed are exposed. For example, an ammonium fluoride solution is used as an etchant of the wet etching technique.

Figure 6:
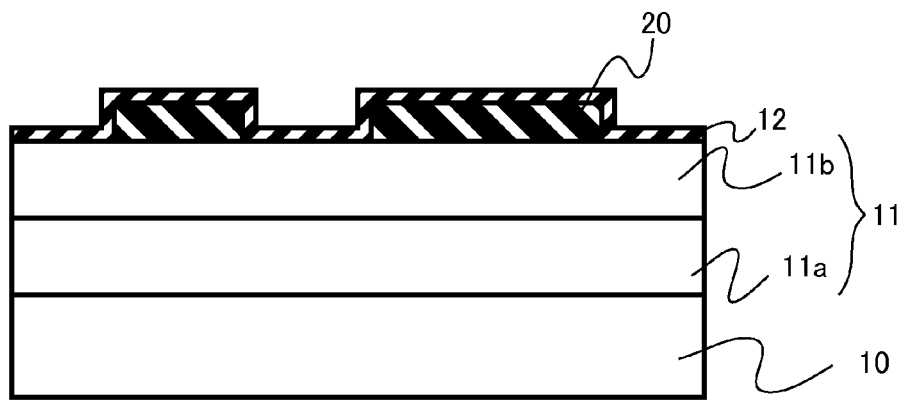
FIG. 6 is a schematic cross-sectional view illustrating the method of manufacturing the semiconductor device of the first embodiment.

Then, a second silicon nitride film 12 is formed on the first silicon nitride film 20 and the barrier layer 11b (FIG. 6). The second silicon nitride film 12 is formed using the PECVD technique. At this time, film forming is performed under the condition that an atomic ratio of silicon to nitrogen in source gas is smaller than when the first silicon nitride film is formed. For example, when silane ($SiH_4$) and ammonia ($NH_4$) are used as a source gas of silicon and source gas of nitrogen, film forming is performed under the condition that a silane/ammonia flow ratio is small. Through this process, the second silicon nitride film 12 that is lower in the atomic ratio of silicon to nitrogen than the first silicon nitride film 20 is formed. For example, the film thickness of the second silicon nitride film 12 is 10 to 50 nm.

Figure 7:
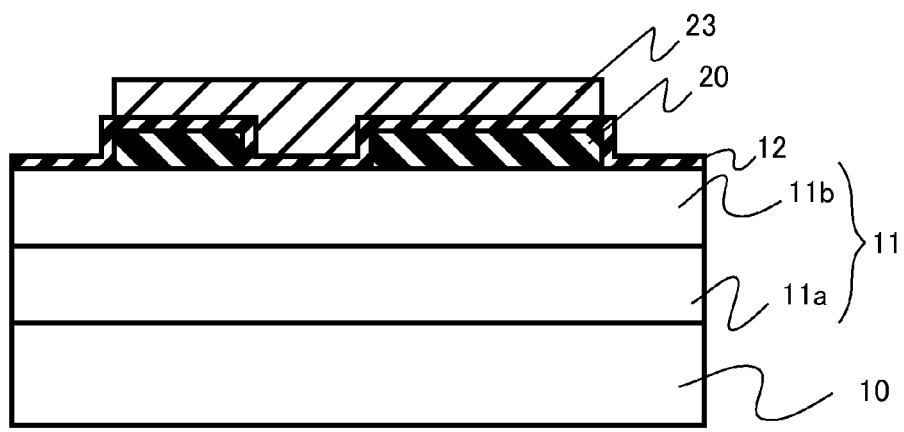
FIG. 7 is a schematic cross-sectional view illustrating the method of manufacturing the semiconductor device of the first embodiment.

Then, a photoresist film 23 is newly formed on the second silicon nitride film 12 by the photolithography technique (FIG. 7). Then, the second silicon nitride film 12 is patterned by the wet etching technique using the photoresist film 23 as the etching mask. The second silicon nitride film 12 is selectively removed, and thus portions of the barrier layer 11b corresponding to regions on which a source electrode and a drain electrode are to be formed are exposed. For example, an ammonium fluoride solution is used as an etchant of the wet etching technique.

Figure 8:
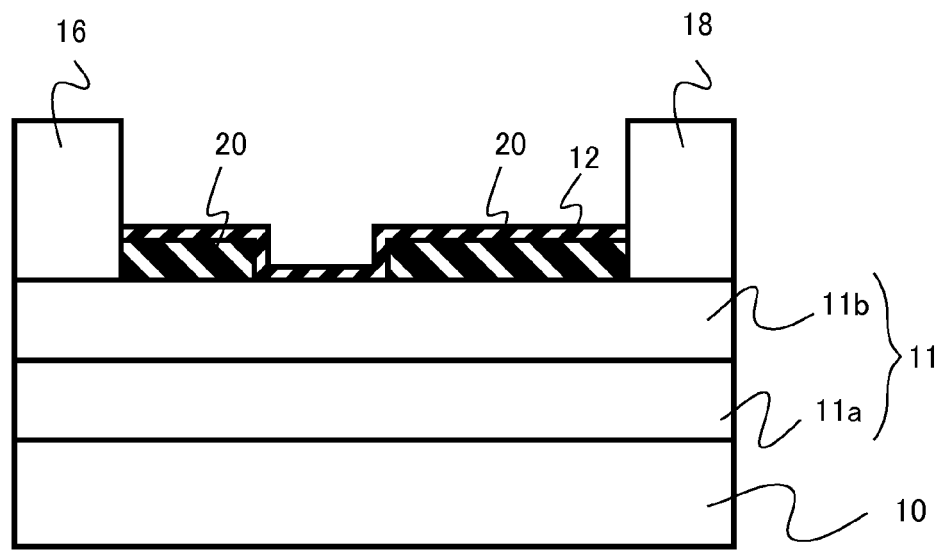
FIG. 8 is a schematic cross-sectional view illustrating the method of manufacturing the semiconductor device of the first embodiment.

Thereafter, a metallic film used to form an ohmic electrode is deposited on the photoresist film 23. For example, the metallic film is an aluminum film. Then, a source electrode 16 and a drain electrode 18 are formed using the lift-off technique (FIG. 8).

Then, a photoresist film (not illustrated) in which a gate electrode portion is opened is newly formed on the second silicon nitride film 12 by the photolithography technique. Further, a metallic film used to form a gate electrode is deposited on the photoresist film. For example, the metallic film is a nickel film. Then, a gate electrode 14 is formed using the lift-off technique.

Through the above manufacturing method, the semiconductor device illustrated in FIG. 1 is manufactured.

Using the PECVD technique, it is easy to form a silicon nitride film having a different atomic ratio of silicon to nitrogen by adjusting the flow ratio of silane ($SiH_4$) and ammonia ($NH_4$) which are source gas. For example, when the silane/ammonia flow ratio is set to 10/8, a silicon nitride film in which an atomic ratio of silicon to nitrogen is 0.86 is formed. Meanwhile, for example, when the silane/ammonia flow ratio is set to 10/30, a silicon nitride film in which an atomic ratio of silicon to nitrogen is 0.68 is formed. Further, the silane/ammonia flow ratio is a flow ratio when silane and ammonia are converted into 100% gas.

Further, the film forming temperature of the PECVD technique is relative low, that is, 250 to 450° C. Thus, since it is easy to form a silicon nitride film having a relatively high hydrogen content, the PECVD technique is useful in forming a passivation film.

In the structure 2 and the structure 3 of FIG. 2 and the film 2 and the film 3 of FIG. 3, a film is formed using the PECVD technique.

According to the present embodiment, it is possible to implement a semiconductor device in which both current collapse and a gate leakage current are suppressed by the above structure.

(Second embodiment)

A method of manufacturing a semiconductor device of the present embodiment is identical to that of the first embodiment except that a first silicon nitride film is formed using a PE-CVD technique, and a second silicon nitride film is formed using a low-pressure chemical vapor deposition (LPCVD) technique. Therefore, the same explanations as those in the first embodiment will not be repeated.

The first silicon nitride film 20 (see FIG. 5) functioning as a passivation film is formed using the PECVD technique under the condition that the silane ($SiH_4$)/ammonia ($NH_4$) flow ratio is relatively high. As a result, a silicon nitride film having a relatively high atomic ratio of silicon to nitrogen is deposited.

Further, the second silicon nitride film 12 functioning as a gate insulating film is formed using the LPCVD technique (see FIG. 6). At this time, film forming is performed under the condition that the second silicon nitride film 12 is lower in the atomic ratio of silicon to nitrogen than the first silicon nitride film 20. For example, the film forming temperature is 600 to 900° C. which is higher than that in the PECVD technique.

The gate insulating film is required to have a low leakage current and a high insulation breakdown voltage in order to use a wide range of driving voltages. Further, a guarantee of a low leakage current and a high insulation breakdown voltage, that is, long-term reliability is required as well.

In the LPCVD technique, film forming is performed at a temperature higher than that in the PECVD technique or the electron cyclotron resonance (ECR) plasma sputtering technique. For this reason, it is possible to form a film having a relatively low hydrogen content. Further, it is easy to reduce particles due to device characteristics. Thus, it is possible to form a high-quality silicon nitride film that is low in a leakage current, high in an insulation breakdown voltage, and excellent in long-term reliability.

Further, using chlorosilane gas such as dichlorosilane as source gas, it is possible to introduce chlorine into a silicon nitride film. Thus, it is possible to form a silicon nitride film in which a gate leakage current is suppressed as well.

The film 5 of FIG. 3 is formed using the LPCVD technique.

According to the present embodiment, the second silicon nitride film 12 having a low atomic ratio of silicon to nitrogen is formed using the LPCVD technique, and thus a semiconductor device having a high-quality gate insulating film is manufactured. Further, a silicon nitride film having a high atomic ratio of silicon to nitrogen is formed as the first silicon nitride film 20 functioning as a passivation film, and thus a semiconductor device in which the current collapse is also suppressed is manufactured.

(Third embodiment)

A method of manufacturing a semiconductor device of the present embodiment is identical to that of the first or second embodiment except that the first silicon nitride film is formed using the ECR plasma sputtering technique, and the second silicon nitride film is formed using the PECVD technique. Thus, the same explanations as those in the first or second embodiment will not be repeated.

The first silicon nitride film 20 (see FIG. 5) functioning as a passivation film is formed using the ECR plasma sputtering technique. At this time, a silicon nitride film having a relatively high atomic ratio of silicon to nitrogen is formed. For example, the film forming temperature is 20 to 300° C.

Further, the second silicon nitride film 12 functioning as a gate insulating film is formed using the PECVD technique (see FIG. 6). At this time, film forming is performed under the condition that the second silicon nitride film 12 is lower in the atomic ratio of silicon to nitrogen than the first silicon nitride film 20.

In the ECR plasma sputtering technique, film forming is performed using only a solid source and nitrogen gas, and thus it is possible to suppress introduction of intermediate products or impurities further than other CVD techniques. Thus, it is suitable as a passivation film forming method of a high-quality semiconductor.

In the structure 1 of FIG. 2 and the film 1 of FIG. 3, film forming is performed using the ECR plasma sputtering technique.

Further, the second silicon nitride film 12 having a low atomic ratio of silicon to nitrogen is formed using the PECVD technique, and thus it is possible to form a gate insulating film in which a gate leakage current is suppressed. Further, compared to that in the ECR plasma sputtering technique, due to device characteristics, it is easy to reduce particles, and thus it is possible to a high-quality gate insulating film.

In the structure 3 of FIG. 2 and the film 3 of FIG. 3, film forming is performed using the PECVD technique under the condition that an atomic ratio of silicon to nitrogen is low.

According to the present embodiment, the second silicon nitride film 12 having an atomic ratio of silicon to nitrogen is formed using the PECVD technique, and thus a semiconductor device having a high-quality gate insulating film is manufactured. Further, a silicon nitride film having a high atomic ratio of silicon to nitrogen is formed as the first silicon nitride film 20 functioning as a passivation film, and thus a semiconductor device in which the current collapse is also suppressed is manufactured. Further, the ECR plasma sputtering technique that is excellent in film quality is used to form the first silicon nitride film 20 functioning as a passivation film, and thus reliability of a semiconductor device is improved as well.

(Fourth embodiment)

A method of manufacturing a semiconductor device of the present embodiment includes forming a first silicon nitride film on a nitride semiconductor layer using an ECR plasma sputtering technique, removing a portion of the first silicon nitride film, exposing the nitride semiconductor layer, and forming a second silicon nitride film on the nitride semiconductor layer using an LPCVD technique, forming a gate electrode on the second silicon nitride film, forming a source electrode on the nitride semiconductor layer, and forming a drain electrode on the nitride semiconductor layer at a side opposite to the source electrode with respect to the gate electrode. The same explanations as those in the first to third embodiments will not be repeated.

The first silicon nitride film 20 (see FIG. 5) functioning as a passivation film is formed using the ECR plasma sputtering technique. For example, the film forming temperature is 20 to 300° C.

Further, the second silicon nitride film 12 functioning as a gate insulating film is formed using the LPCVD technique (see FIG. 6). At this time, it is preferable that film forming be performed under the condition that the second silicon nitride film 12 is lower in the atomic ratio of silicon to nitrogen than the first silicon nitride film 20. For example, the film forming temperature is 600 to 900° C. which is higher than that in the ECR plasma sputtering technique.

In the ECR plasma sputtering technique, film forming is performed using only a solid source and nitrogen gas, and thus it is possible to suppress introduction of intermediate products or impurities further than other CVD techniques. Thus, it is suitable as a passivation film forming method of a high-quality semiconductor.

In the structure 1 of FIG. 2 and the film 1 of FIG. 3, film forming is performed using the ECR plasma sputter.

Further, as described above, it is possible to form a silicon nitride film that is low in a leakage current, high in an insulation breakdown voltage, and excellent in long-term reliability using the LPCVD technique.

The film 5 of FIG. 3 is formed using the LPCVD technique.

According to the present embodiment, the second silicon nitride film 12 is formed using the LPCVD technique, and thus a semiconductor device having a high-quality gate insulating film is manufactured. Further, the ECR plasma sputtering technique that is excellent in film quality is used to form the first silicon nitride film 20 functioning as a passivation film, and thus reliability of a semiconductor device is improved as well.

(Fifth embodiment)

A semiconductor device of the present embodiment is identical to that of the first embodiment except that a third silicon nitride film is formed on the nitride semiconductor layer between the source electrode and the gate electrode, and is lower in the atomic ratio of silicon to nitrogen than the first silicon nitride film. Therefore, the same explanations as those in the first embodiment will not be repeated.

Figure 9:
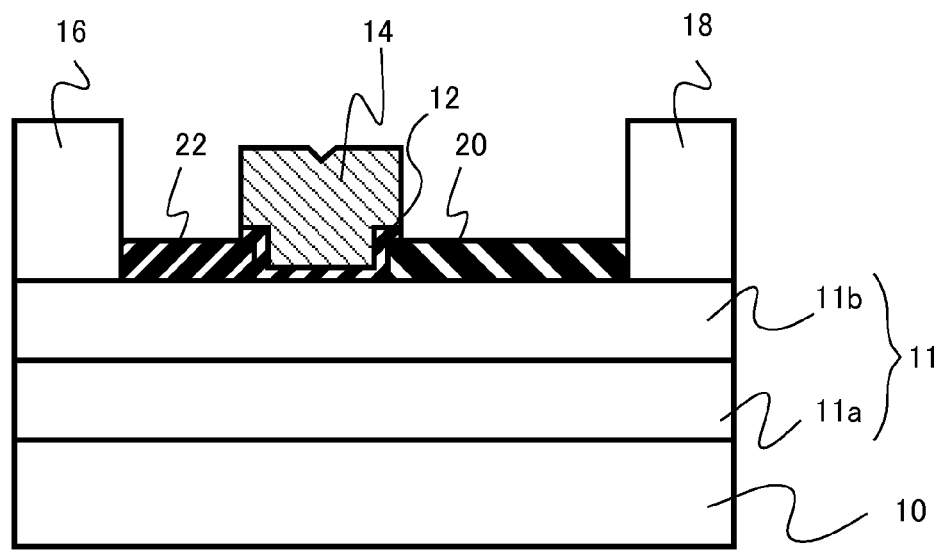
FIG. 9 is a cross-sectional view illustrating a structure of a semiconductor device of a fifth embodiment.

FIG. 9 is a cross-sectional view illustrating a structure of a semiconductor device of the present embodiment. A third silicon nitride film 22 is formed on the nitride semiconductor layer 11 between the source electrode 16 and the gate electrode 14, and is lower in the atomic ratio of silicon to nitrogen than the first silicon nitride film 20.

The charge trapping causing the current collapse is remarkable between the gate electrode 14 and the drain electrode 18 between which a high electric field is applied. For this reason, from a point of view of suppression of the current collapse, there is a little limitation to the film properties of the third silicon nitride film 22 formed on the nitride semiconductor layer 11 between the source electrode 16 and the gate electrode 14. Thus, the film properties can be optimized focusing on an improvement in characteristics other than the current collapse.

According to the present embodiment, by lowering the atomic ratio of silicon to nitrogen in the third silicon nitride film 22 than that in the first silicon nitride film 20, a leakage current, for example, in a passivation film is suppressed, and a leakage current between the gate electrode 14 and the nitride semiconductor layer 11 or between the gate electrode 14 and the source electrode 16 is suppressed. Thus, it is possible to provide a semiconductor device of a high breakdown voltage.

(Sixth embodiment)

A semiconductor device of the present embodiment is identical to that of the fifth embodiment except that a third silicon nitride film and a second silicon nitride film formed on a nitride semiconductor layer between a source electrode and a gate electrode are continued the same film. Therefore, the same explanations as those in the fifth embodiment will not be repeated.

Figure 10:
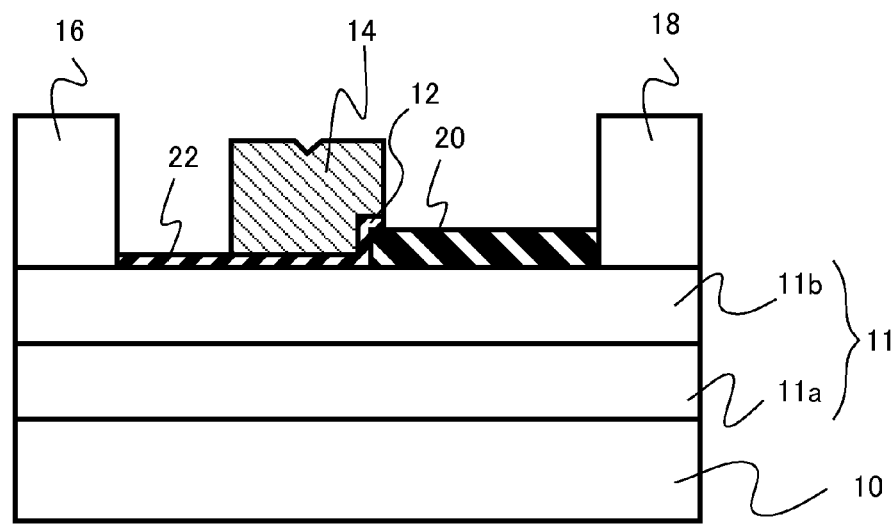
FIG. 10 is a cross-sectional view illustrating a structure of a semiconductor device of a sixth embodiment.

FIG. 10 is a cross-sectional view illustrating a structure of a semiconductor device of present embodiment. A third silicon nitride film 22 is formed on the nitride semiconductor layer 11 between the source electrode 16 and the gate electrode 14, and is lower in the atomic ratio of silicon to nitrogen than the first silicon nitride film 20. Further, the third silicon nitride film 22 and the second silicon nitride film 12 are continued the same film.

In the structure of FIG. 10, a portion of the gate electrode 14 of the gate length of the semiconductor device at the source electrode 16 side is specified by processing of the gate electrode 14 itself rather than processing of the passivation film (the first silicon nitride film 20).

According to the present embodiment, the same effects as in the fifth embodiment are obtained. Further, one end of the gate length can be specified only by patterning of a resist used to perform the lift-off process on the gate electrode rather than a wet etching that is large in a process conversion difference and a process variation. Thus, a variation in a gate length is suppressed, and it is possible to stabilize characteristics of the semiconductor device.

(Seventh embodiment)

A semiconductor device of the present embodiment is identical to that of the first embodiment except that an end portion of a gate electrode is formed in a groove formed in a passivation film. Therefore, the same explanations as those in the first embodiment will not be repeated.

Figure 11:
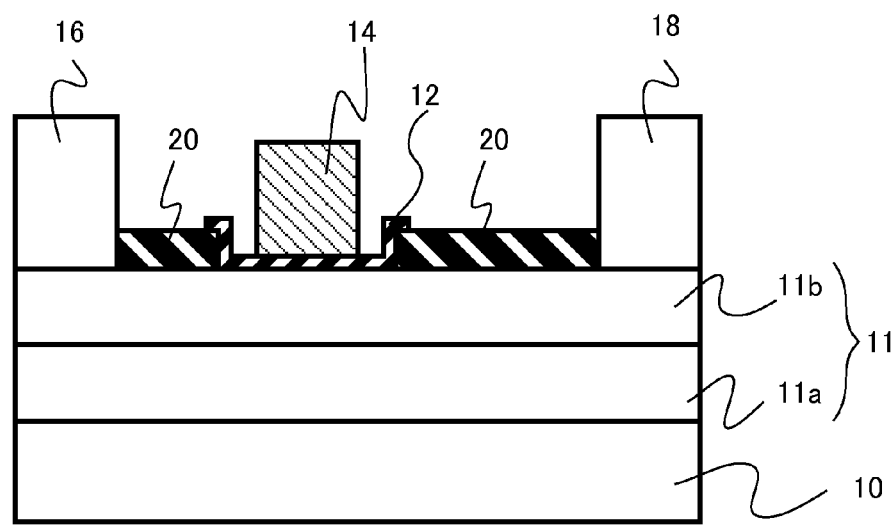
FIG. 11 is a cross-sectional view illustrating a structure of a semiconductor device of a seventh embodiment.

FIG. 11 is a cross-sectional view illustrating a structure of a semiconductor device of the present embodiment. An end portion of the gate electrode 14 is formed on a portion of the second silicon nitride film 12 corresponding to a groove formed in the first silicon nitride film 20 functioning as a passivation film.

According to the present embodiment, both ends of the gate length can be specified only by patterning of a resist used to perform the lift-off process on the gate electrode rather than a wet etching that is large in a process conversion difference and a process variation. Thus, a variation in a gate length is suppressed, and it is possible to stabilize characteristics of the semiconductor device.

(Eighth embodiment)

A semiconductor device of the present embodiment is identical to that of the first embodiment except that a second silicon nitride film is interposed between a source electrode and a first silicon nitride film and between a drain electrode and a first silicon nitride film. Therefore, the same explanations as those in the first embodiment will not be repeated.

Figure 12:
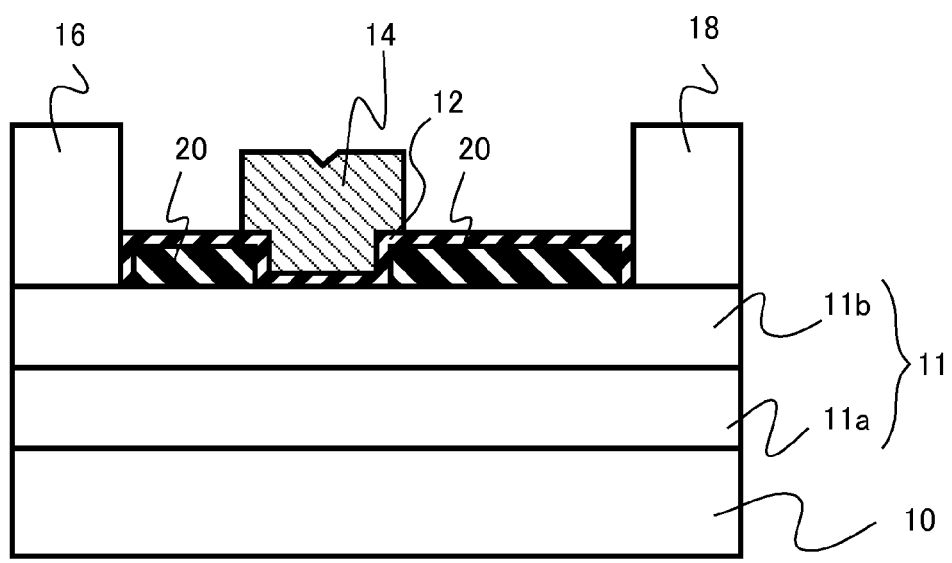
FIG. 12 is a cross-sectional view illustrating a structure of a semiconductor device of an eighth embodiment.

FIG. 12 is a cross-sectional view illustrating a structure of a semiconductor device of the present embodiment. The second silicon nitride film 12 is interposed between the source electrode 16 and the first silicon nitride film 20 and between the drain electrode 18 and the first silicon nitride film 20.

According to the present embodiment, the second silicon nitride film 12 functions as a diffusion preventing film, and can prevent metal such as aluminum contained in the source electrode 16 or the drain electrode 18 from being diffused into the first silicon nitride film 20. Thus, it is possible to suppress a phenomenon that metal contained in the source electrode 16 or the drain electrode 18 is diffused into the first silicon nitride film 20 or the nitride semiconductor layer 11, and thus device characteristics vary.

The above embodiments have been described using a field effect transistor (FET) employing a hetero junction as an example, but the present disclosure is not limited to the above examples and can be applied to other transistors employing a nitride semiconductor.

While certain embodiments have been described, these embodiments have been presented by way of example only, and are not intended to limit the scope of the inventions. Indeed, a semiconductor device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a nitride semiconductor layer;
   a gate electrode provided on the nitride semiconductor layer;
   a source electrode provided on the nitride semiconductor layer;
   a drain electrode provided on the nitride semiconductor layer at a side opposite to the source electrode with respect to the gate electrode;
   a first silicon nitride film provided on the nitride semiconductor layer between the drain electrode and the gate electrode; and
   a second silicon nitride film provided between the nitride semiconductor layer and the gate electrode, the second silicon nitride film being provided continuously from one edge of the gate electrode to the other edge of the gate electrode, an atomic ratio of silicon to nitrogen in the second silicon nitride film being lower than an atomic ratio of silicon to nitrogen in the first silicon nitride film.

2. The device according to claim 1,
   wherein the atomic ratio of silicon to nitrogen in the first silicon nitride film is 0.75 or more.

3. The device according to claim 1,
   wherein a hydrogen content of the first silicon nitride film is 10 at. % or more.

4. The device according to claim 1,
   wherein a dielectric constant of the first silicon nitride film is 7 or less.

5. The device according to claim 1,
wherein the first silicon nitride film has tensile stress.

6. The device according to claim 1,
wherein a hydrogen content of the second silicon nitride film is lower than a hydrogen content of the first silicon nitride film.

7. The device according to claim 1,
wherein a chlorine content of the second silicon nitride film is 0.5 at. % or more.

8. The device according to claim 1, further comprising,
a third silicon nitride film provided on the nitride semiconductor layer between the source electrode and the gate electrode, an atomic ratio of silicon to nitrogen in the third silicon nitride film being lower than the atomic ratio of silicon to nitrogen in the first silicon nitride film.

9. The device according to claim 1,
wherein the nitride semiconductor layer has a stacked structure of a gallium nitride and an aluminum gallium nitride stacked on the gallium nitride, and the first and second silicon nitride films are provided on the aluminum gallium nitride.

\* \* \* \* \*